US008337231B2

United States Patent
Hsu et al.

(10) Patent No.: US 8,337,231 B2
(45) Date of Patent: Dec. 25, 2012

(54) INDEPENDENT LOADING MECHANISM STRUCTURE HAVING LEVER INCORPORATED WITH ROLLER

(75) Inventors: Shuo-Hsiu Hsu, New Taipei (TW); Jia-Hau Liu, New Taipei (TW)

(73) Assignee: Hon Hai Precision Ind. Co., Ltd., New Taipei (TW)

(*) Notice: Subject to any disclaimer, the term of this patent is extended or adjusted under 35 U.S.C. 154(b) by 0 days.

(21) Appl. No.: 13/095,914

(22) Filed: Apr. 28, 2011

(65) Prior Publication Data

US 2011/0269326 A1 Nov. 3, 2011

(30) Foreign Application Priority Data

Apr. 28, 2010 (TW) .............................. 99207738 A

(51) Int. Cl.
*H01R 4/50* (2006.01)
(52) U.S. Cl. ....................................................... 439/342
(58) Field of Classification Search .................. 439/342, 439/331, 296, 259, 265, 266, 330
See application file for complete search history.

(56) References Cited

U.S. PATENT DOCUMENTS

| | | | |
|---|---|---|---|
| 5,489,218 A * | 2/1996 | McHugh | 439/342 |
| 6,406,317 B1 * | 6/2002 | Li et al. | 439/342 |
| 6,638,093 B1 | 10/2003 | Chang | |
| 6,746,263 B2 * | 6/2004 | Luo | 439/342 |
| 6,923,462 B2 * | 8/2005 | Tantius | 280/124.155 |
| 7,029,309 B2 * | 4/2006 | Ma | 439/331 |
| 7,402,067 B2 * | 7/2008 | Hsu et al. | 439/342 |
| 7,435,124 B2 * | 10/2008 | Ma et al. | 439/331 |
| 7,686,637 B2 | 3/2010 | Yi et al. | |
| 2004/0147154 A1 * | 7/2004 | Chang | 439/342 |
| 2006/0148297 A1 * | 7/2006 | Ma | 439/331 |
| 2010/0130048 A1 * | 5/2010 | Fan | 439/331 |

* cited by examiner

*Primary Examiner* — Alexander Gilman
(74) *Attorney, Agent, or Firm* — Wei Te Chung; Ming Chieh Chang

(57) ABSTRACT

An independent loading mechanism (ILM) for an electrical connector comprises a stiffener, a load plate and a lever pivotally mounted to two opposite sides of the stiffener. The lever stamped and bent from a metal sheet is configured with a depressing portion having a cam tab bent from one side thereof, a pair of rollers mounted onto the depressing portion, an operating portion interconnected to the depressing portion. The cam tab can press the load plate toward the stiffener. The rollers located at two sides of the cam tab can engage with the stiffener to reduce rotational friction between the stiffener and the lever when rotating the operating portion from a horizontal direction to a vertical direction.

19 Claims, 5 Drawing Sheets

INDEPENDENT LOADING MECHANISM STRUCTURE HAVING LEVER INCORPORATED WITH ROLLER

BACKGROUND OF THE INVENTION

1. Field of the Invention

The present invention relates to an independent loading mechanism (ILM) for an electrical connector, and more particularly, and particularly, to an ILM incorporated with an lever incorporated with a roller such that rotational friction between a stiffener and the lever can be readily and effectively reduced. The present invention also relates to a method making the ILM.

2. Description of Related Art

An independent loading mechanism (ILM) for an electrical connector having an insulating housing with a plurality of terminals disclosed in U.S. Pat. No. 7,029,309 which is issued to Ma on Apr. 18, 2006 includes a stiffener of a frame configuration and enclosingly attached to the insulating housing, a load plate and a lever pivotally mounted to opposite sides of the stiffener. A clasping portion is formed on one side of the load plate for hinging the load plate to the stiffener. A tongue portion extends from a side of the load plate opposite to the clasping portion.

The lever repeatedly bent from a cylindrical metal rod includes an operation portion, a handle bent from a free end of the operation portion for facilitating actuating the lever, a locating portion substantially perpendicular to the operation portion and bent from one end of the operation portion, and an offset cam portion repeatedly bent from a middle of the locating portion and paralleling to the locating portion. The cam portion can engage with the tongue portion of the load plate to press the chip module seated on the insulating housing toward the insulating housing, so as to achieve electrical connection between the chip module and the electrical connector.

However, the lever repeatedly bent from a cylindrical metal rod causes bending angles difficult to control during bending process and cost high.

Hence, it is desirable to provide an improved ILM for an electrical connector to overcome the aforementioned disadvantages.

SUMMARY OF THE INVENTION

Accordingly, an object of the present invention is to provide an ILM for an electrical connector incorporated with improved lever incorporated with a roller such that rotational friction between a stiffener and the lever can be readily and effectively reduced.

According to one aspect of the present invention, an independent loading mechanism (ILM) for an electrical connector comprises a stiffener, a load plate and a lever pivotally assembled to the stiffener. The lever stamped and bent from a metal sheet is configured with a depressing portion having a cam tab for pressing the load plate toward the stiffener, and an operating portion interconnected to the depressing portion for rotating the depressing portion toward the stiffener.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
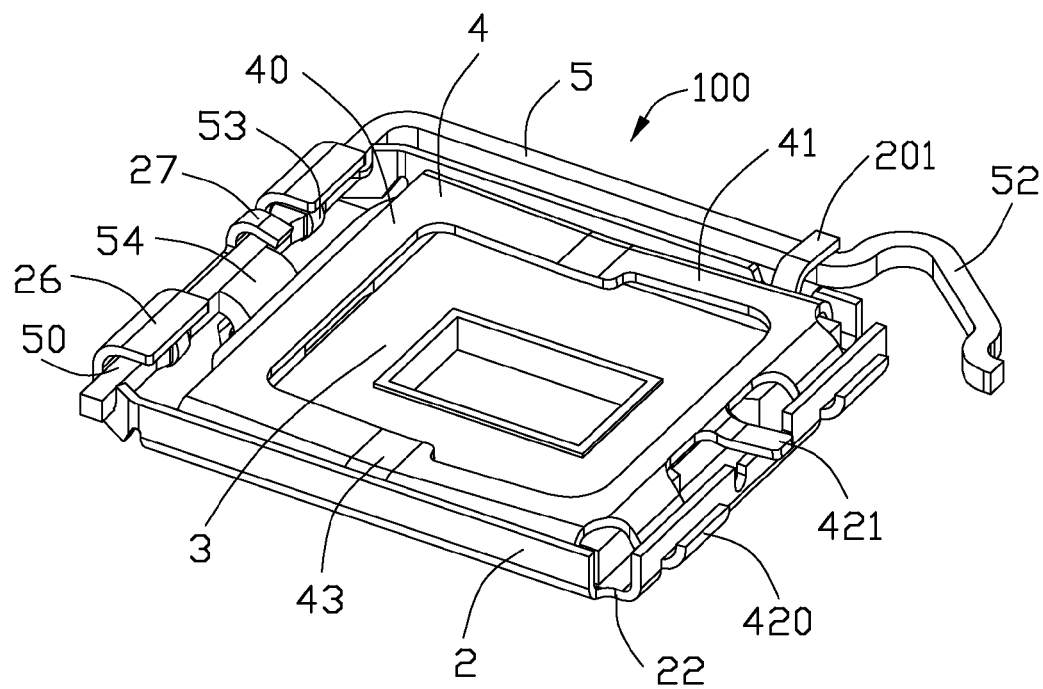
FIG. 1 is an assembled, isometric view of a present preferred embodiment of an electrical connector with an independent loading mechanism (ILM) according to the invention, showing the electrical connector being in a closed position.
Figure 2:
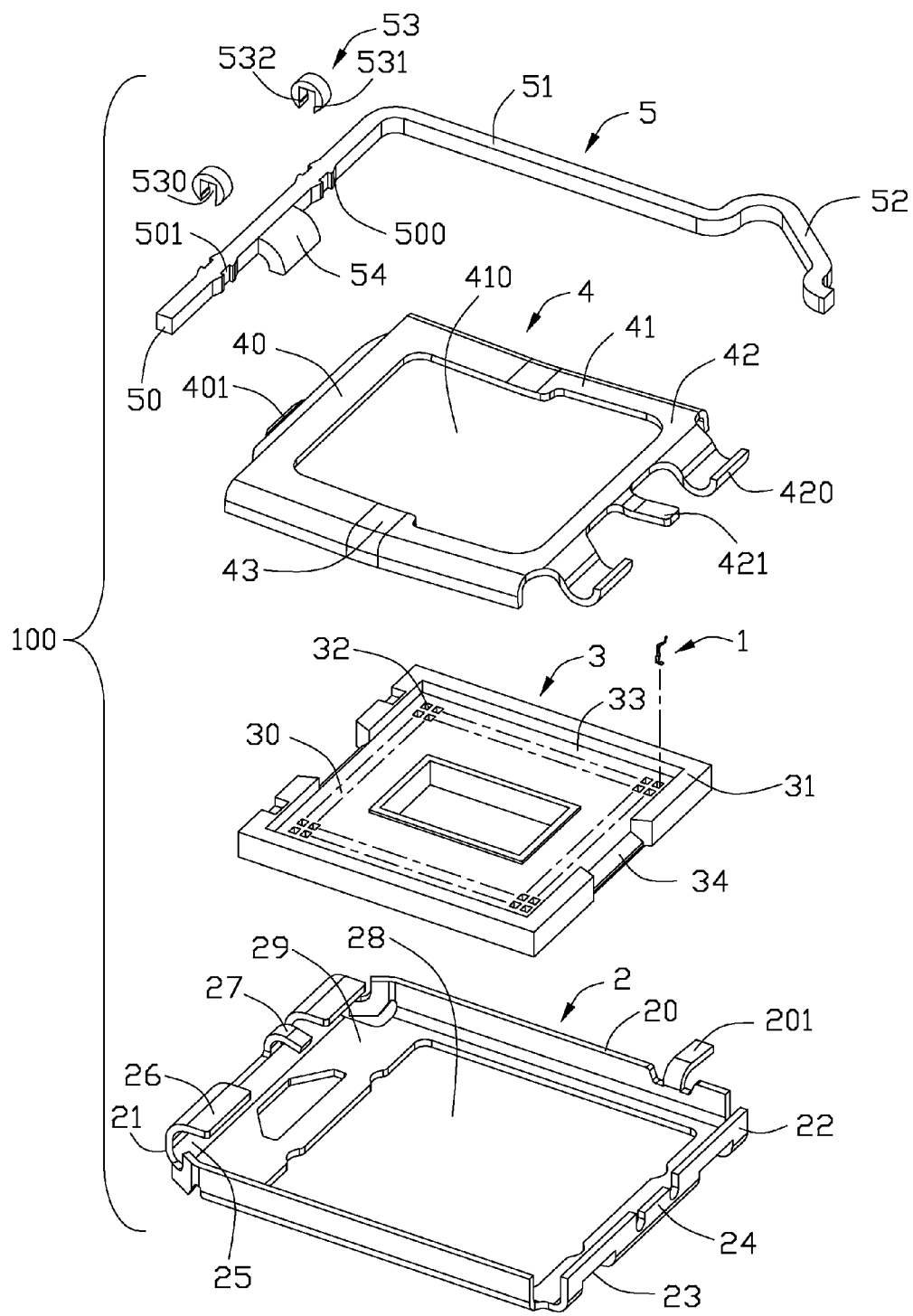
FIG. 2 is an exploded, perspective view of the electrical connector of FIG. 1.
Figure 3:
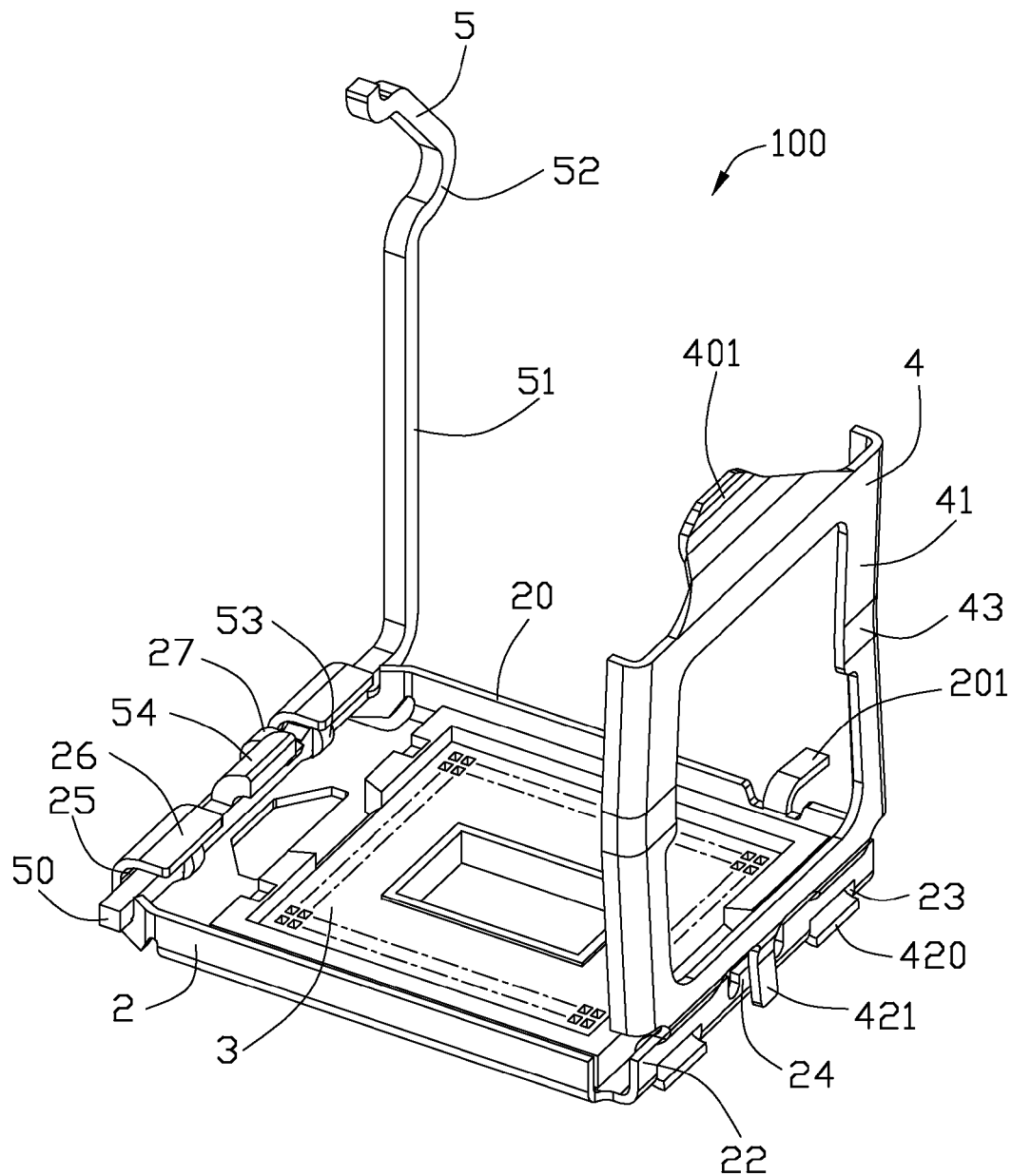
FIG. 3 is another assembled, isometric view of the electrical connector of FIG. 1, showing the electrical connector being in an open position.

FIGS. 1 to 3 illustrate an electrical connector 100 with an independent loading mechanism (ILM) in accordance to a preferred embodiment of the present invention, which is generally used for connecting a processing unit (CPU) (not shown) to a printed circuit board (PCB) (not shown). The electrical connector 100 comprises a rectangular insulating housing 3 having a plurality of terminals 1 received therein and an ILM enclosingly attached to the insulating housing 3 for pressing the CPU toward the insulating hosing 3 to establish electrical connection between the electrical connector 100 and the CPU (not shown). The ILM comprises a stiffener 2 attached to the insulating housing 3, a load plate 4 and a lever 5 pivotally assembled to two opposite ends of the stiffener 2.

Referring to FIG. 2, the stiffener 2 is generally a rectangular frame, which has four integrated sides 29 defining an opening 28 for receiving the insulating housing 3. The stiffener 2 comprises a front and rear baffles 21, 22 both extending upwardly from external side edges of two opposite sides 29, and two opposite side baffles 20 between the front and rear baffles 21, 22. The front baffle 21 has two separated fastening pieces 26 bent from two ends of a top edge thereof. The fastening pieces 26 extend toward the rear baffle 22 and define a channel 25 with the corresponding side 29 for receiving the lever 5.

The front baffle 21 also defines a buckling portion 27 located between two fastening pieces 26. The buckling portion 27 is disposed near one fastening piece 26 and bends downwardly from a top edge of the front baffle 21. The buckling portion 27 can engage with the lever 5 to prevent the lever 5 separating from the stiffener 2 in a horizontal direction (seen from FIG. 3). A pair of locking openings 23 is defined on the rear baffle 22 for engaging with the load plate 4 to assemble the load plate 4 on the stiffener 2. The rear baffle 22 also defines a supporting portion 24 at middle thereof. A semi-arc retaining portion 201 is formed on one of the side baffles 20, for locking the lever 5 in a closed position.

The insulating housing 3 received in the opening 29 of the stiffener 2 comprises a plate-like base 30, four sidewalls 31 extending upwardly from the base 30 and a receiving cavity 33 for receiving the CPU (not shown) defined by the base 30 and the sidewalls 31. The base 30 defines a number of passageways 32 extending therethrough, for receiving corresponding terminals 1. Two opposite sidewalls 32 each has a recess 34 in middle thereof, for easily removing the CPU (not shown) from the insulating housing 3.

The load plate 4 rotatably pivoted to the rear baffle 22 of the stiffener 2 is generally a rectangular configuration. The load plate 4 has a first side 40 adjacent to the front baffle 21 when assembly, a second side 42 opposite to the first side 40, and two opposite third sides 41 interconnecting the first and second sides 40, 42. A tongue 401 extends from a middle portion of the first side 40 and can engage with the lever 5 to press the CPU (not shown) towards the insulting housing 3. Two spaced clasps 420 symmetrically extends outwardly from the second side 40 and engage with the locking openings 23 of the stiffener 2 for hinging the load plate 4 to the stiffener 2.

The second side 42 also has a tab 421 at a middle portion thereof and located between the clasps 420. The tab 421 extends outwardly from the second side 42 and can abut against the supporting portion 24 of the stiffener 2 to prevent the load plate 4 separating from the stiffener 2 caused by excessively rotation (seen from FIG. 3). Each third side 41 defines a bending portion 43 for pressing the CPU (not shown) to achieve electrical connection between the electrical connector 100 and the CPU (not shown) when the load plate 4 is in closed position.

Referring to FIGS. 1-3, the lever 5 stamped and bent from a plate-like metal sheet is generally of an L-shaped configuration. The lever 5 pivotally assembled to a front end 21 of the stiffener 2 includes a rectangular depressing portion 50 receiving in the channel 25 of the stiffener 2, two rollers 53 disposed on the depressing portion 50, a rectangular operating portion 51 bent from one end of the depressing portion 50 and substantially perpendicular to the depressing portion 50, and a handle 52 bent from a free end of the operating portion 51 for facilitatively actuating the lever 5. The depressing portion 50 defines four pairs of protrusions 500 respectively protruding from two opposite sides thereof. Each receiving slot 501 for receiving the corresponding roller 53 is formed between every two adjacent protrusions 500 disposed at a same side of the depressing portion 50. The receiving slots 501 are formed on the depressing portion 50 corresponding to the fastening pieces 26 of the stiffener 2.

The lever 5 also has a cam tab 54 bent downwardly from a middle portion of the depressing portion 50. The cam tab 54 having a semi-arc configuration is disposed between two receiving slots 501 located at a same side of the depressing portion 50 and can engages with a tongue 401 of the load plate 4 to press the load plate 4 toward the stiffener 2. The cam tab 54 can abut against the buckling portion 27 of the stiffener 2 to prevent the lever 5 separating from the stiffener 2 along a horizontal direction. The cam tab 54 and the operating portion 51 are located at a same side of the depressing portion 50. The rollers 53 each substantially having an O-shaped configuration can contact with the corresponding fastening piece 26 of the stiffener 2 to reduce rotational friction between the fastening pieces 26 of the stiffener 2 and the depressing portion 50 of the lever 5 when the operating portion 51 of the lever 5 is rotated from a vertical direction (seen from FIG. 3) to a horizontal direction (seen from FIG. 1).

Each roller 53 has a holding opening 530 sunk inwardly and upwardly from a bottom portion thereof and a pair of holding arms 531 located at two opposite sides of the holding opening 530. Each holding arm 531 is received in the corresponding slot 501 to prevent the roller 53 from sliding along an axial direction of the depressing portion 50. Each holding arm 531 defines a hook 532 protruding inwardly from a free end thereof. The hook 532 can abut against a bottom of the depressing portion 50 to prevent the roller 53 separating from the depressing portion 50 along a direction vertical to the axial direction of the depressing portion 50. Each holding arm 531 has a width same with that of the receiving slot 501.

Figure 4:
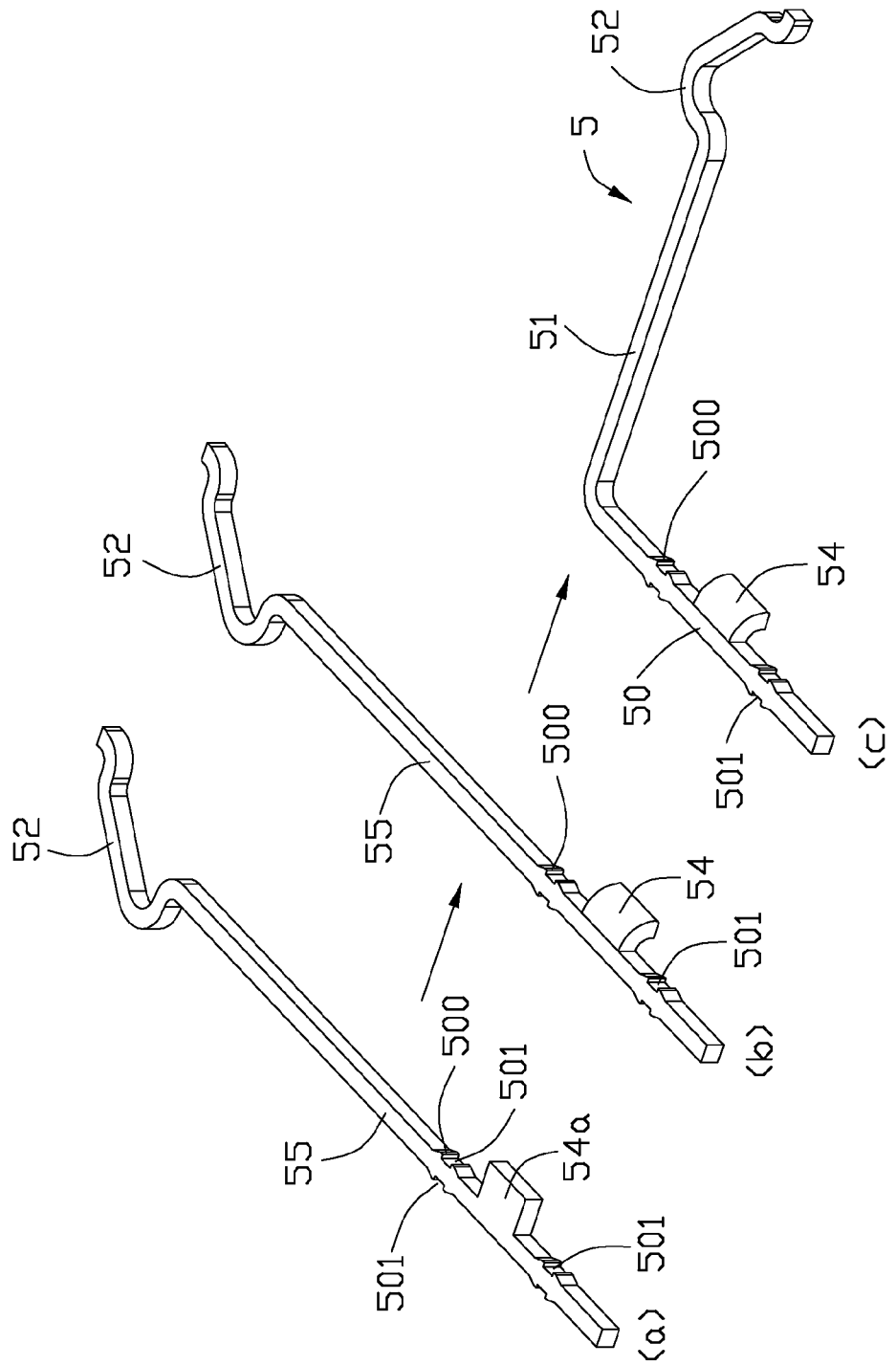
FIG. 4(a)-(c) show a process of a method for manufacturing a lever of the ILM shown in FIG. 2.

Referring to FIGS. 4(a)-4(c) show a process of a method for manufacturing the lever 5 of the ILM. The method comprises steps as following: (a) providing a plate-like metal sheet; (b) stamping the metal sheet to form a straight bar 55 with a rectangular cross-section, the bar 55 having four pairs of protrusions 500 and a plate-like cam tab 54a disposed at one end thereof, and a bending handle 52 located at the other end thereof, the protrusions 500 located at two opposite sides of the bar 55 and every two adjacent protrusion 500 located at a same side of the bar 55 defining a slot 501 therebetween, a plate-like cam tab 54a being disposed on one side of the bar 55 and located between the slots 501; (c) bending the plate-like cam tab 54a downwardly to form the cam tab 54 of a semi-arc shaped configuration; (d) laterally bending the straight bar 55 at a predetermined position located between the slot 501 near the handle 52 and the handle 52 to form a depressing portion 50 and an operating portion 51 perpendicular to the depressing portion 50.

Figure 5:
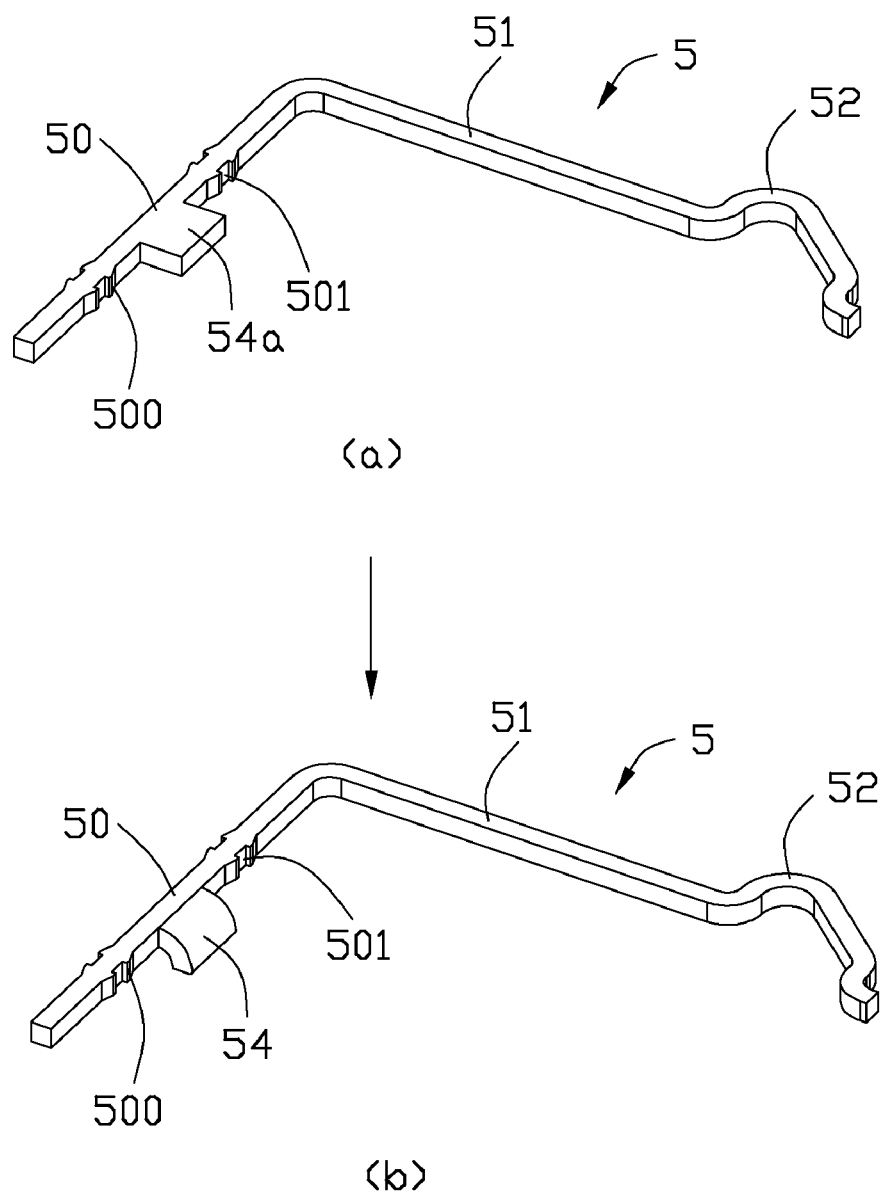
FIG. 5(a)-(b) show a process of another method for manufacturing the lever shown in FIG. 2.

Referring to FIGS. 5(a)-5(b) show a process of another method for manufacturing the lever 5 of the ILM. The method comprises such steps as: (a) providing a plate-like metal sheet; (b) stamping the metal sheet to form an L-shaped lever 5, the lever 5 having a depressing portion 50 with a plate-like cam tab 54a, an operating portion 51 located at one end of the depressing portion 50 and perpendicular to the depressing portion 50, and a bending handle 52 disposed at a free end of the operating portion 51, the depressing portion 50 having four pair of protrusions 500 located at two opposite sides thereof, every two adjacent protrusions 500 located at a same side of the depressing portion 50 defining a slot 501 therebetween, the plate-like cam tab 54a being disposed at a middle portion of the depressing portion 50 and located between two the slots 501, the cam tab 54a being located at a same side of the depressing portion 50 with the operating portion 51; (c) bending the cam tab 54a downwardly to form the cam tab 51 of a semi-arc shaped configuration.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An independent loading mechanism (ILM) for an electrical connector comprising:
   a stiffener;
   a load plate pivotally assembled to the stiffener; and
   a lever pivotally mounted on the stiffener to lock the load plate; and
   wherein the lever is made from a metal sheet by stamping and bending so as to define a non-circular cross-section thereof, the lever is configured with a depressing portion having a cam tab for pressing the load plate, and an operating portion interconnected to the depressing portion for rotating the depressing portion toward the stiffener, and wherein
   said depressing portion is equipped with a pair of rollers each having an interior non-circular holding opening to snugly and compliantly receive the depressing portion therein while defining a circular exterior cross-section for rotation.

2. The ILM as claimed in claim 1, wherein the stiffener has a front baffle engaging with the lever, a rear baffle opposite to the front baffle and two side baffles between the front and rear baffles, and wherein the front baffle has two fastening pieces extending toward the rear baffle, and wherein the lever has a pair of rollers assembled on the depressing portion to engage with the corresponding fastening pieces when the operating portion is rotated from a horizontal direction to a vertical direction.

3. The ILM as claimed in claim 2, wherein the stiffener has a buckling portion bent downwardly from a top edge of the front baffle and located between two fastening pieces, and wherein the cam tab of the lever abuts against the buckling portion to prevent the lever separating from the stiffener along a horizontal direction.

4. The ILM as claimed in claim 2, wherein the cam tab is located between two rollers, and wherein each roller comprises a holding opening sunk inwardly and upwardly from a bottom portion thereof and a pair of holding arms formed at two sides of the holding opening.

5. The ILM as claimed in claim 4, wherein the lever has a plurality of slots formed on the depressing portion for receiving the corresponding holding arms of the rollers.

6. The ILM as claimed in claim 5, wherein the lever has a plurality of protrusions protruding from two sides of the depressing portion, and wherein each slot is formed between every two adjacent protrusions at a same side of the depressing portion.

7. The ILM as claimed in claim 1, wherein the cam tab and the operating portion of the lever are located at a same side of the depressing portion, and wherein the lever has a bending handle formed at a free end of the operating portion, and wherein the operating portion is perpendicular to the depressing portion.

8. The ILM as claimed in claim 1, wherein a cross-section of the lever is rectangular while a roller structure is applied upon the depression portion for rotation of the depression with regard to the stiffener.

9. The ILM as claimed in claim 1, wherein each holding arm defines a hook at a free end thereof, and the hook can abut against a bottom portion of the depressing portion to prevent the roller separating from the lever.

10. An electrical connector comprising:
an insulating housing having a plurality of terminals received therein;
an independent loading mechanism (ILM) including:
a stiffener attached to the insulating housing;
a load plate and a lever pivotally mounted on the stiffener;
the lever being configured having a depressing portion with a substantially rectangular cross-sectional rod and an operating portion integrally formed with the depressing portion for rotating the depressing portion toward the stiffener, a pair of rollers assembled to the depressing portion to engage with the stiffener and a cam tab integrally formed with depressing portion and disposed between the rollers for pressing the load plate toward the stiffener; and wherein
the depressing portion has at least three different cross-sections such as at the area of the rollers, the cam tab, and the rod expect the rollers and the cam tab.

11. The electrical connector as claimed in claim 10, wherein each roller includes a pair of holding arms interferingly engaging with the depressing portion and a holding opening formed between the holding arms for receiving a corresponding portion of the depressing portion.

12. The electrical connector as claimed in claim 11, wherein the depressing portion has a plurality of protrusions protruding outwardly from two sides thereof, and wherein a plurality of slots are formed between every two adjacent protrusions located at a same side of the depressing portion, for receiving the corresponding holding arms of the rollers.

13. The electrical connector as claimed in claim 10, wherein the lever has a bending handle formed at a free end of the operating portion, and wherein the operating portion is perpendicular to the depressing portion and located at a same side of the depressing portion with the cam tab.

14. The electrical connector as claimed in claim 10, wherein the stiffener includes a pair of fastening pieces extending from one side thereof and a buckling portion disposed between two fastening pieces, and wherein the rollers each has an arc-shaped surface contacting with the fastening pieces when the operating portion is rotated from a horizontal direction to a vertical direction, and wherein the cam tab of the lever engages with the buckling portion to prevent the lever separating from the stiffener along a horizontal direction.

15. The electrical connector as claimed in claim 10, wherein each holding arm defines a hook at a free end thereof, for clasping a bottom portion of the depressing portion.

16. An electrical connector for use with an electronic package, comprising:
an insulative housing defining an upward facing receiving cavity for receiving said electronic package;
a plurality of contacts disposed in the housing with contacting sections upwardly extending into the receiving cavity; and
a stiffener defining a first retaining section with a lever pivotally mounted thereon, and a second retaining section with a load plate pivotally mounted thereon, said first retaining section and said second retaining section being located by two opposite ends of the housing, respectively, in a front-to-back direction; wherein
said lever defines a depressing portion with thereof a rotation axis about which said depressing portion rotates with regard to the first retaining area, under condition of a roller concentrically, about said rotation axis, surrounding a portion of the depressing portion and located in the first retaining area for supportable rotation of the lever.

17. The electrical connector as claimed in claim 16, wherein the depressing portion defines a non-circular cross-section, and the roller defines an interior holding opening with said non-circular cross-sectional thereof and a circular cross-section thereof externally.

18. The electrical connector as claimed in claim 17, wherein said depressing portion further inherently defines a cam tab for pressing the load plate, and said cam tab defines another non-circular cross-section which is configured and dimensioned different from and larger than said non-circular cross-section.

19. The electrical connector as claimed in claim 18, wherein said rotation axis continues at a place of said cam tab axially.

* * * * *